United States Patent
Fong et al.

(10) Patent No.: US 9,620,729 B2
(45) Date of Patent: Apr. 11, 2017

(54) ORGANIC THIN FILM TRANSISTOR AND METHOD OF MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Honhang Fong, Beijing (CN); Yingtao Xie, Beijing (CN); Shihong Ouyang, Beijing (CN); Shucheng Cai, Beijing (CN); Qiang Shi, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/769,313

(22) PCT Filed: Nov. 14, 2014

(86) PCT No.: PCT/CN2014/091113
§ 371 (c)(1),
(2) Date: Aug. 20, 2015

(87) PCT Pub. No.: WO2016/026221
PCT Pub. Date: Feb. 25, 2016

(65) Prior Publication Data
US 2016/0268527 A1     Sep. 15, 2016

(51) Int. Cl.
*H01L 51/05*    (2006.01)
*H01L 51/10*    (2006.01)
*H01L 51/00*    (2006.01)

(52) U.S. Cl.
CPC ........ *H01L 51/105* (2013.01); *H01L 51/0018* (2013.01); *H01L 51/055* (2013.01);
(Continued)

(58) Field of Classification Search
CPC ... H01L 51/05; H01L 51/105; H01L 51/0529; H01L 51/0508; H01L 51/0512
See application file for complete search history.

(56) References Cited

U.S. PATENT DOCUMENTS

| 7,230,267 B2 | 6/2007 | Nagayama et al. |
| 8,367,459 B2 | 2/2013 | Stecker et al. |
| (Continued) | | |

FOREIGN PATENT DOCUMENTS

| CN | 1495931 A | 5/2004 |
| CN | 102598333 A | 7/2012 |
| (Continued) | | |

OTHER PUBLICATIONS

International Search Report of PCT/CN2014/091113 in Chinese, mailed May 22, 2015 with English translation.
(Continued)

*Primary Examiner* — Phuc Dang
(74) *Attorney, Agent, or Firm* — Collard & Roe, P.C.

(57) ABSTRACT

An organic thin film transistor and a method of manufacturing the same, an array substrate and a display device are disclosed. The thin film transistor including: a source electrode (4), a drain electrode (5), an organic semiconductor layer (6) disposed on the source electrode (4) and drain electrode (5), and a modified layer (7); the modified layer (7) is disposed at a position below an organic semiconductor layer (6) and corresponding to the source electrode (4) and the drain electrode (5), covers the source electrode (4) and the drain electrode (5), and is configured to change a contact angle on both the source electrode (4) and the drain electrode (5). The thin film transistor avoids the problems of poor formation effects and easy disconnection of the organic semiconductor layer (6) because of the large contact angle on electrode layers, and therefore reduces production costs.

20 Claims, 4 Drawing Sheets

(52) U.S. Cl.
CPC ...... *H01L 51/0529* (2013.01); *H01L 51/0545* (2013.01); *H01L 51/107* (2013.01)

(56) References Cited

U.S. PATENT DOCUMENTS

| | | | |
|---|---|---|---|
| 2007/0090362 A1 | 4/2007 | Ahn et al. | |
| 2007/0194305 A1* | 8/2007 | Kim | H01L 51/105 257/40 |
| 2008/0067504 A1* | 3/2008 | Park | C07F 9/091 257/40 |
| 2008/0157068 A1* | 7/2008 | Lee | H01L 51/105 257/40 |
| 2010/0032654 A1 | 2/2010 | Zhang et al. | |
| 2010/0117077 A1* | 5/2010 | Yamazaki | H01L 29/78618 257/43 |
| 2012/0211740 A1 | 8/2012 | Müller | |
| 2013/0099215 A1 | 4/2013 | Kushida et al. | |
| 2013/0140548 A1* | 6/2013 | Kohiro | H01L 51/0071 257/40 |
| 2013/0228756 A1* | 9/2013 | Lee | H01L 51/52 257/40 |

FOREIGN PATENT DOCUMENTS

| | | |
|---|---|---|
| CN | 102870202 A | 1/2013 |
| WO | 2012/081648 A1 | 6/2012 |

OTHER PUBLICATIONS

Notice of Transmittal of the International Search Report of PCT/CN2014/091113 in Chinese, mailed May 22, 2015.

Written Opinion of the International Searching Authority of PCT/CN2014/091113 in Chinese, mailed May 22, 2015 with English translation.

First Chinese Office Action of Chinese Application No. 201410413117.2, mailed Jun. 25, 2015 with English translation.

Second Chinese Office Action of Chinese Application No. 201410413117.2, mailed Nov. 26, 2015 with English translation.

* cited by examiner

ORGANIC THIN FILM TRANSISTOR AND METHOD OF MANUFACTURING THE SAME, ARRAY SUBSTRATE AND DISPLAY DEVICE

CROSS REFERENCE TO RELATED APPLICATIONS

This application is the National Stage of PCT/CN2014/091113 filed on Nov. 14, 2014, which claims priority under 35 U.S.C. §119 of Chinese Application No. 201410413117.2 filed on Aug. 20, 2014, the disclosure of which is incorporated by reference.

TECHNICAL FIELD

At least one embodiment of the present invention relates to an organic thin film transistor and a method of manufacturing the same, an array substrate and a display device.

BACKGROUND

Over recent years, with the continuous development of technology, the performance of electronic devices (for example, thin film transistor devices in display panels) has been gradually improved. The source electrode and the drain electrode of a thin film transistor are generally made of a metal material, which guarantees the conductivity of the source electrode and the drain electrode. Meanwhile, in order to ensure the performance of electronic devices, an organic semiconductor layer is generally formed on the source electrode and the drain electrode.

SUMMARY

At least one embodiment of the present invention provides an organic thin film transistor and a method of manufacturing the same, an array substrate and a display device so as to avoid the problem of easy disconnection of organic semiconductor layers because of a large contact angle on electrode layers in the organic thin film transistor, and therefore reduce production costs.

In a first aspect, at least one embodiment of the present invention provides an organic thin film transistor, comprising: a source electrode, a drain electrode, an organic semiconductor layer disposed on the source electrode and the drain electrode, and a modified layer disposed at a position below the organic semiconductor layer and corresponding to the source electrode and the drain electrode; the modified layer covers the source electrode and the drain electrode; and the modified layer is configured to change a contact angle on both the source electrode and the drain electrode.

In a second aspect, at least one embodiment of the present invention provides an array substrate, comprising the organic thin film transistor as described in the first aspect.

In a third aspect, at least one embodiment of the present invention provides a display device, comprising the organic thin film transistor as described in the first aspect or the array substrate as described in the second aspect.

In a fourth aspect, at least one embodiment of the present invention provides a method of manufacturing an organic thin film transistor, the method comprising: forming a source electrode, a drain electrode and an organic semiconductor layer on the source electrode and the drain electrode, and forming a modified layer at a position on the source electrode and the drain electrode and corresponding to the organic semiconductor layer, the modified layer covering the source electrode and the drain electrode and being configured to change a contact angle on both the source electrode and the drain electrode.

BRIEF DESCRIPTION OF THE DRAWINGS

In order to illustrate the technical solutions of the embodiments of the present invention more clearly, the figures of the embodiments are simply described below. Apparently, the figures described below merely relate to some embodiments of the present invention rather than are limitative of the present invention.

The reference signs are as follows: 1—base substrate; 2—gate electrode; 3—gate insulating layer; 4—source electrode; 5—drain electrode; 6—organic semiconductor layer; 7—modified layer; 8—buffer layer.

DETAILED DESCRIPTION

To make the object, technical solutions, and advantages of the present invention clearer, the technical solutions of the embodiments of the present invention will be described below in a clearer and more complete way with reference to the figures of the embodiments of the present invention. Apparently, the embodiments described are only part, rather than all of the embodiments of the present invention. Based on the embodiments of the present invention described, all the other embodiments obtained by a person of ordinary skill in the art without paying inventive work fall within the scope of protection of the present invention.

The inventors of the present application have noted that because the contact angle on both the source electrode and the drain electrode of the thin film transistor is large, poor spreading behavior will occur upon forming an organic semiconductor layer, which results in an non-uniform thickness of the organic semiconductor layer finally formed, thereby may tend to cause a disconnection of the semiconductor layer. As such, the properties of the thin film transistor cannot be guaranteed.

Figure 1:
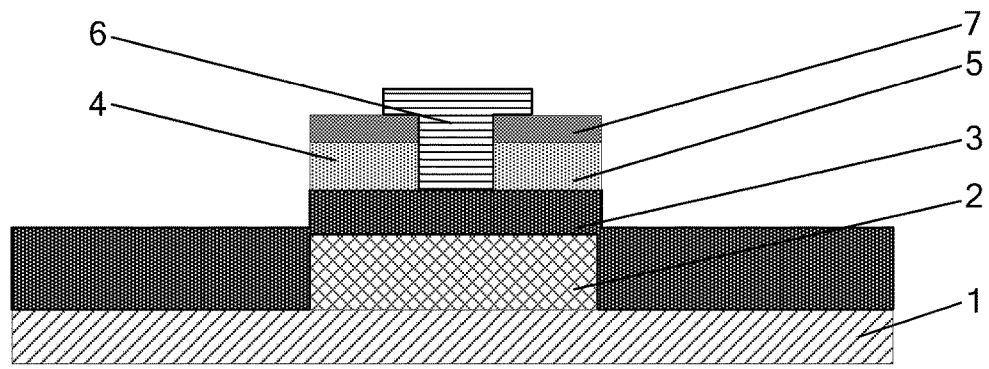
FIG. 1 is a schematic view of an organic thin film transistor provided in an embodiment of the present invention.

At least one embodiment of the present invention provides an organic thin film transistor which can be selected from the group consisting of two types, i.e., a gate electrode bottom contact and a gate electrode top contact, where only the gate bottom contact mode is illustrated in the embodiments of the present invention. Referring to FIG. 1, the organic thin film transistor comprises: a base substrate 1, a gate electrode 2, a gate insulating layer 3, a source electrode 4, a drain electrode 5, an organic semiconductor layer 6 disposed on the source electrode 4 and the drain electrode 5, and a modified layer 7; the modified layer 7 is disposed at a position on the source electrode 4 and the drain electrode 5 and corresponding to the organic semiconductor layer 6, completely covers the source electrode 4 and the drain electrode 5, and is configured to change a contact angle on both the source electrode 4 and the drain electrode 5.

In at least one embodiment, the modified layer can be made using organic micromolecular materials or self-assembled micromolecular materials such as hexamethyl disilazane (abbreviated as HMDS) and octyltrichlorosilane (abbreviated as OTS). A modified layer is manufactured on the source electrode and the drain electrode. Since the modified layer can react with the molecules in the source electrode and the drain electrode, the contact angle on both the source electrode and the drain electrode will be reduced after reaction, thereby reducing the surface potential of the source electrode and the drain electrode. As a result, the organic semiconductor layer can be uniformly formed, which improves the spreading effect of the organic semiconductor layer and guarantees the stability of the thin film transistor.

The base substrate can be a glass substrate, a plastic substrate, a substrate of stainless steel and an insulating film, or the like. The gate insulating layer may be formed by first forming an insulating thin film using silicon oxide, silicon nitride, metal oxide, metal nitride or an organic insulating film material and then by a patterning process. The gate insulating layer may have a thickness from 30 to 1000 nm. The gate electrode may be formed using a metal, ITO, doped silicon, an organic conductive material and the like, and its thickness may be from 20 to 200 nm. Generally, the source electrode and the drain electrode are formed using precious metals such as gold (Au), silver (Ag) and the like, and their thickness may be from 1 to 30 nm.

In an organic thin film transistor provided in an embodiment of the present invention, a modified layer that can change a contact angle on both the source electrode and the drain electrode is provided at a position below the organic semiconductor layer of the thin film transistor and corresponding to the source electrode and the drain electrode, the modified layer reducing the contact angle on both the source electrode and the drain electrode. Therefore, the organic semiconductor layer can be in full contact with the source electrode and the drain electrode, which ensures that the organic semiconductor layer can be formed uniformly on both the source electrode and the drain electrode, solves the problems of poor formation effects and easy disconnection of the organic semiconductor layer because of a large contact angle on electrode layers in the thin film transistor, guarantees the quality and performance of the thin film transistor, avoids the waste of materials, and therefore reduces production costs.

Figure 2:
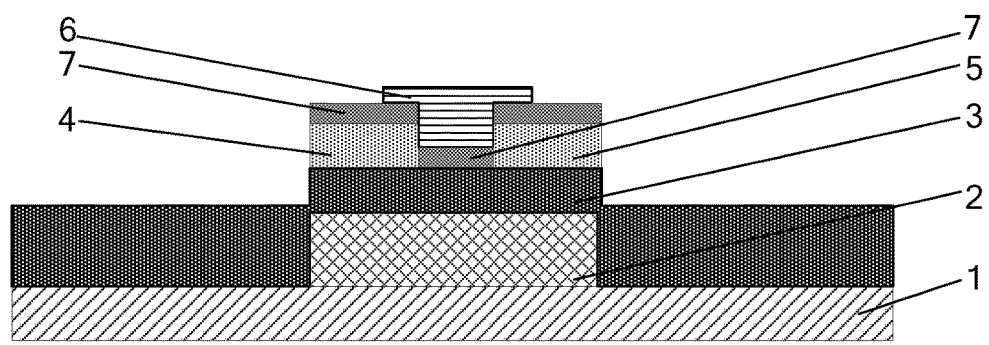
FIG. 2 is a schematic view of another organic thin film transistor provided in an embodiment of the present invention.

In one embodiment, as shown in FIG. 2, the modified layer 7 can also be provided at a position between the organic semiconductor layer 6 and the gate insulating layer 3. The modified layer 7 can also be configured to change a contact angle on the gate insulating layer 3, i.e., the modified layer 7 provided at a position between the organic semiconductor layer 6 and the gate insulating layer 3 can be configured to change the contact angle on the gate insulating layer 3.

It should be noted that the organic semiconductor layer in an embodiment of the present invention is formed on the source electrode and the drain electrode. As shown in FIG. 2, part of the organic semiconductor layer will be in direct contact with the gate insulating layer. By further forming a modified layer on the gate insulating layer, the contact angle on the gate insulating layer can be reduced, which facilitates the preparation of an organic semiconductor layer and guarantees the uniformity of the thickness of the organic semiconductor layer formed.

Figure 3:
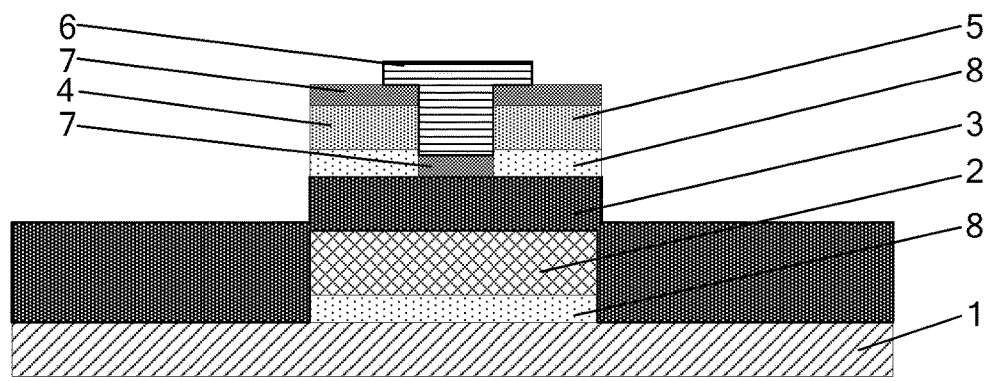
FIG. 3 is a schematic view of a still another organic thin film transistor provided in an embodiment of the present invention.

In at least one embodiment, as shown in FIG. 3, the organic thin film transistor may further include a buffer layer disposed at a position below and corresponding to an electrode, the buffer layer 8 being covered by the electrode and an adhesion force of a material of the buffer layer 8 being greater than that of a material of the electrode. In at least one embodiment, the electrode comprises at least one selected from the group consisting of the source electrode, the drain electrode and the gate electrode. FIG. 3 shows that the electrode comprises the source electrode, the drain electrode and the gate electrode, i.e., the buffer layer 8 is disposed at a position below and corresponding to the source electrode 4, the drain electrode 5 and the gate electrode 2 respectively. The buffer layer 8 is covered by the source electrode 4, the drain electrode 5, and the gate electrode 2 respectively. The adhesion force of a material of the buffer layer 8 is greater than that of a material of the source electrode, the drain electrode and the gate electrode.

When a metal electrode is formed using a precious metal material such as gold, silver and the like, the source electrode, the drain electrode and the gate electrode formed will tend to shed because of the poor surface adhesion force of the precious metal material. In the embodiments of the present application, a buffer layer is further manufactured blow the source electrode, the drain electrode and the gate electrode. Because of the high surface adhesion force of the material of the buffer layer, the source electrode, the drain electrode and the gate electrode can be formed stably on a base substrate, which avoids the occurrence of shedding of the source electrode, the drain electrode and the gate electrode and guarantees the performance of the organic thin film transistor.

It should be noted FIG. 3 shows that a buffer layer 8 is provided based on the thin film transistor as shown in FIG. 2, but the embodiments of the present invention are not limited thereto, for example, a buffer layer can be further provided based on the thin film transistor as shown in FIG. 1, i.e., in this case, no modified layer is provided between the organic semiconductor layer and the gate insulating layer.

In at least one embodiment, the buffer layer may be made using materials with strong adhesion force such as common metals (molybdenum (Mo), aluminum (Al), copper (Cu), alloy or the like), indium tin oxide (abbreviated as ITO)) and the like.

In at least one embodiment, the modified layer 7 may have a thickness from 0.1 to 10 nm.

In at least one embodiment, the buffer layer 8 may have a thickness from 20 to 300 nm.

The thickness of the buffer layer is set as from 20 to 300 nm and the thickness of the modified layer is set as from 0.1 to 10 nm, which can ensure that the buffer layer and the modified layer formed can achieve the function that should exist in each layer structure, and at the same time avoid the occurrence of the following cases: the buffer layer and the modifier layer being excessively thick, which results in the thickness of the thin film transistor formed being too large, and in turn results in the box thickness of the display device finally formed being too large, and reducing the display effect of the display device, which affects the performance of the display device.

Upon actually manufacturing an organic thin film transistor, the thickness of the buffer layer, the modified layer, the gate electrode, the source electrode and the drain electrode can be reasonably set taking factors such as the specific requirement, cost, practicability and the like into account, so as to avoid the case in which the thickness of the thin film transistor formed is too large, and at the same time ensure that each layer structure can fully play its own role.

In addition, the organic thin film transistor provided in the above embodiment of the present invention can further comprise an over coat covering the organic semiconductor layer, the source electrode, the drain electrode, and a data line.

In an organic thin film transistor provided in an embodiment of the present invention, a modified layer that can change a contact angle on both the source electrode and the drain electrode can be provided at a position below the organic semiconductor layer of the organic thin film transistor and corresponding to the source electrode and the drain electrode, the modified layer reducing the contact angle on both the source electrode and the drain electrode, so that the organic semiconductor layer can be in full contact with the source electrode and the drain electrode, which ensures that the organic semiconductor layer can be formed uniformly on the source electrode and the drain electrode, which solves the problems of poor formation effects and easy disconnection of the organic semiconductor layer because of a large contact angle on electrode layers in the thin film transistor, guarantees the quality and performance of the thin film transistor, avoids the waste of materials, and therefore reduces production costs. Thereby the production efficiency is improved.

At least one embodiment of the present invention provides an array substrate, comprising an organic thin film transistor provided in any one of the above embodiments, the organic thin film transistor being selected from the group consisting of two types, i.e., a gate electrode bottom contact and a gate electrode top contact.

In the array substrate provided in the embodiments of the present invention, a modified layer that can change a contact angle on both the source electrode and the drain electrode can be provided at a position below the organic semiconductor layer of the array substrate and corresponding to the source electrode and the drain electrode, the modified layer reducing the contact angle on both the source electrode and the drain electrode. Therefore, the organic semiconductor layer can be in full contact with the source electrode and the drain electrode, which ensures that the organic semiconductor layer can be formed uniformly on the source electrode and the drain electrode, solves the problems of poor formation effects and easy disconnection of the organic semiconductor layer because of a large contact angle on electrode layers in the thin film transistor, guarantees the quality and performance of the thin film transistor, avoids the waste of materials, and therefore reduces production costs. Thereby the production efficiency is improved.

At least one embodiment of the present invention provides a display device, comprising the array substrate or the organic thin film transistor provided in any of the above embodiments of the present invention. The display device can be selected from the group consisting of any product or component having display function such as display panels, mobile phones, tablet computers, televisions, laptops, digital picture frames, navigators and the like.

In the display device provided in the embodiments of the present invention, a modified layer that can change a contact angle on both the source electrode and the drain electrode can be provided at a position below the organic semiconductor layer of the display device and corresponding to the source electrode and the drain electrode, the modified layer reducing the contact angle on both the source electrode and the drain electrode. Therefore, the organic semiconductor layer can be in full contact with the source electrode and the drain electrode, which ensures that the organic semiconductor layer can be formed uniformly on the source electrode and the drain electrode, solves the problems of poor formation effects and easy disconnection of the organic semiconductor layer because of a large contact angle on electrode layers in the thin film transistor, guarantees the quality and performance of the thin film transistor, avoids the waste of materials, and therefore reduces production costs, thereby improving production efficiency.

At least one embodiment of the present invention provides a method for manufacturing an organic thin film transistor, the method comprising: forming a source electrode, a drain electrode, and an organic semiconductor layer on the source electrode and the drain electrode, and forming a modified layer at a position on the source electrode and the drain electrode and corresponding to the organic semiconductor layer, the modified layer covering the source electrode and the drain electrode and being configured to change a contact angle on both the source electrode and the drain electrode.

In the method for manufacturing an organic thin film transistor provided in the embodiments of the present invention, the organic thin film transistor can be selected from the group consisting of two types, i.e., a gate electrode bottom contact and a gate electrode top contact. In the following embodiments of the present invention, only the gate electrode bottom contact is illustrated as an example. Meanwhile, in order to facilitate understanding, in the embodiments of the present invention, the modified layer formed at a position corresponding to the source electrode and the drain electrode and below the organic semiconductor layer is called a first modified layer and the modified layer between the gate insulating layer and the organic semiconductor layer is called a second modified layer. Needless to say, it is only defined herein that the positions of the modified layer formed are different, but the materials for forming the modified layer can be the same.

Figure 4:
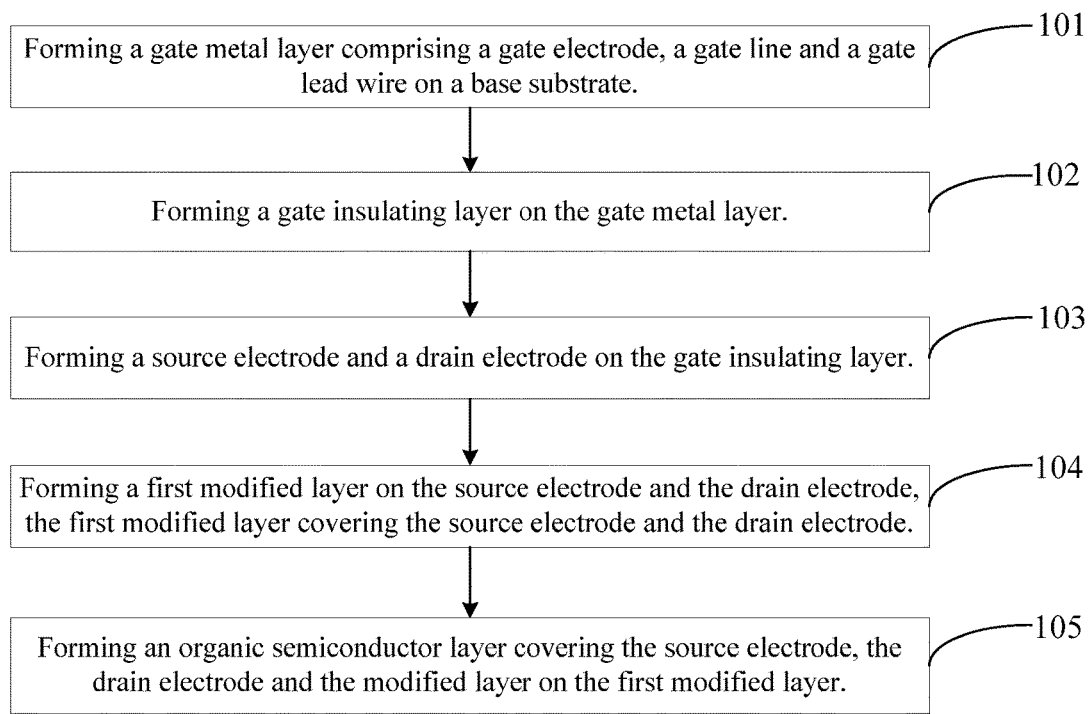
FIG. 4 is a flow chart of a method for manufacturing an organic thin film transistor provided in an embodiment of the present invention.

For example, as shown in FIG. 4, the method may comprise the following Step 101 to Step 105, which will be described in detail below.

Step 101. Forming a gate metal layer comprising a gate electrode, a gate line and a gate lead wire on a base substrate.

For example, a metal thin film having a thickness from 1000 Å to 7000 Å can be deposited on a base substrate such as a glass substrate or a quartz substrate using a magnetron sputtering method, wherein precious metals such as gold or silver generally can be employed for the metal thin film. Then, a gate metal layer is formed on a certain area of the base substrate using a mask plate by patterning processes such as exposure, development, etching, peeling and the like.

Step 102. Forming a gate insulating layer on the gate metal layer.

For example, a gate insulating layer thin film having a thickness from 1000 Å to 6000 Å can be deposited on a glass substrate using chemical vapor deposition or a magnetron sputtering method, wherein the material of the gate insulating layer thin film generally comprises silicon nitride, and silicon oxide, silicon oxynitride and the like can also be used.

Step 103. Forming a source electrode and a drain electrode on the gate insulating layer.

For example, the source electrode and the drain electrode can be formed using a method similar to that of forming a gate electrode.

Step 104. Forming a first modified layer on the source electrode and the drain electrode, the first modified layer covering the source electrode and the drain electrode and being configured to change a contact angle on both the source electrode and the drain electrode.

For example, a film for forming the material of a modified layer is first plated on the source electrode and the drain electrode and then a pattern of the modified layer is formed by a patterning process, or a pattern of the modified layer is first formed using a photoresist and then coating the material of the modified layer.

Step 105. Forming an organic semiconductor layer covering the source electrode, the drain electrode and the modified layer on the first modified layer.

For example, the organic semiconductor layer can be formed by depositing a thin film of a metal oxide semiconductor on the first modified layer using chemical vapor deposition and then subjecting the thin film of the metal oxide semiconductor to a patterning process to form the organic semiconductor layer, i.e., after coating a photoresist, the organic semiconductor layer is formed by exposing, developing and etching the base substrate using a common mask plate.

In at least one embodiment, the manufacturing method may further comprise: forming a gate insulating layer and forming the modified layer at a position between the gate insulating layer and the organic semiconductor layer, the modified layer being also configured to change a contact angle on the gate insulating layer, i.e., the modified layer located at a position between the gate insulating layer and the organic semiconductor layer is configured to change the contact angle on the gate insulating layer.

Figure 5:
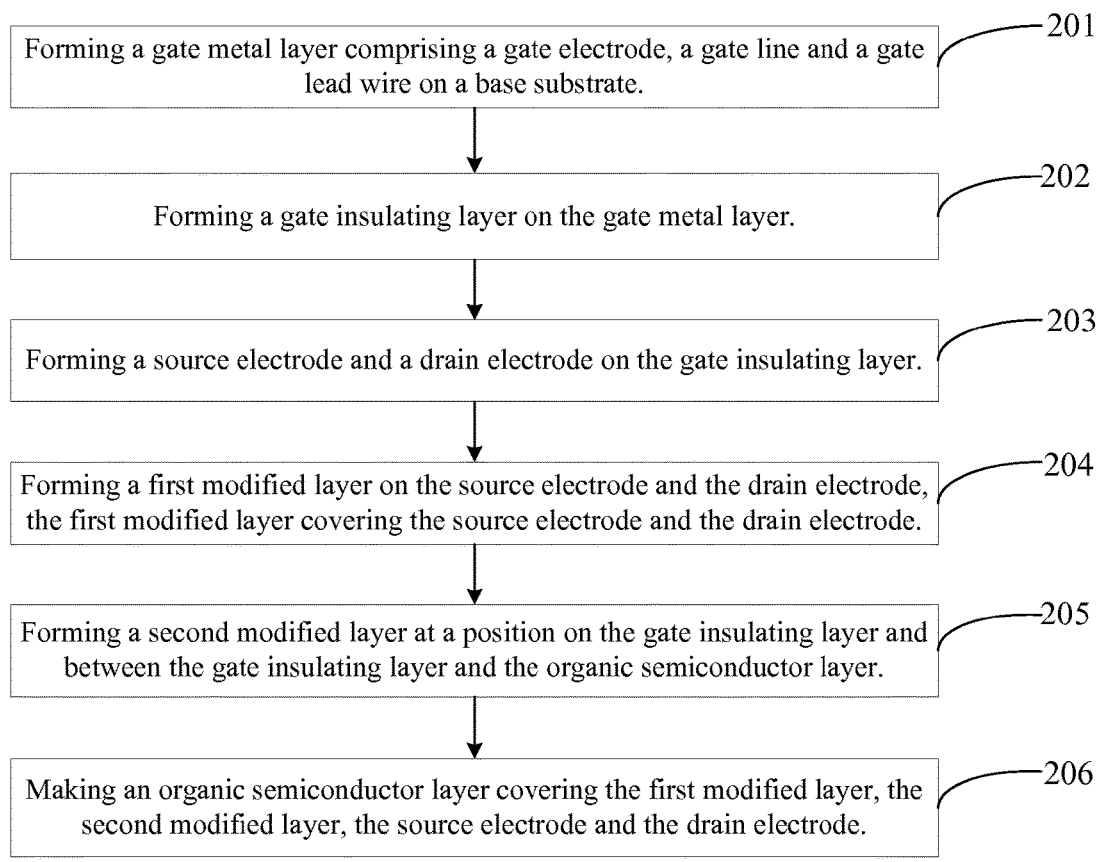
FIG. 5 is a flow chart of another method for manufacturing an organic thin film transistor provided in an embodiment of the present invention.

For example, as shown in FIG. 5, the method may comprise the following Steps 201 to Step 206, which will be described in detail below.

Step 201. Forming a gate metal layer comprising a gate electrode, a gate line and a gate lead wire on a base substrate.

Step 202. Forming a gate insulating layer on the gate metal layer.

Step 203. Forming a source electrode and a drain electrode on the gate insulating layer.

Step 204. Forming a first modified layer on the source electrode and the drain electrode, the first modified layer covering the source electrode and the drain electrode.

Step 205. Forming a second modified layer at a position on the gate insulating layer and between the gate insulating layer and the organic semiconductor layer.

For example, the second modified layer can be formed using the same method for forming a first modified layer.

Step 206. Making an organic semiconductor layer covering the first modified layer, the second modified layer, the source electrode and the drain electrode.

It should be noted that the processes in the present embodiment which are the same as the steps in the above embodiments can be described with reference to the above embodiments, and no further detail will need to be provided herein.

In at least one embodiment, the method may further comprise: forming a gate electrode, and forming a buffer layer below the gate electrode, the source electrode and the drain electrode respectively, the buffer layer being covered by the gate electrode, the source electrode and the drain electrode; the adhesion force of a material of the buffer layer is greater than that of a material of the source electrode, the drain electrode and the gate electrode. The embodiments of the present invention are not limited thereto, for example, a buffer layer can be formed only below the source electrode and the drain electrode respectively, the buffer layer being covered by the source electrode and the drain electrode, wherein the adhesion force of a material of the buffer layer is greater than that of a material of the source electrode and the drain electrode, i.e., in this case, no modified layer is provided between the organic semiconductor layer and the gate insulating layer.

Figure 6:
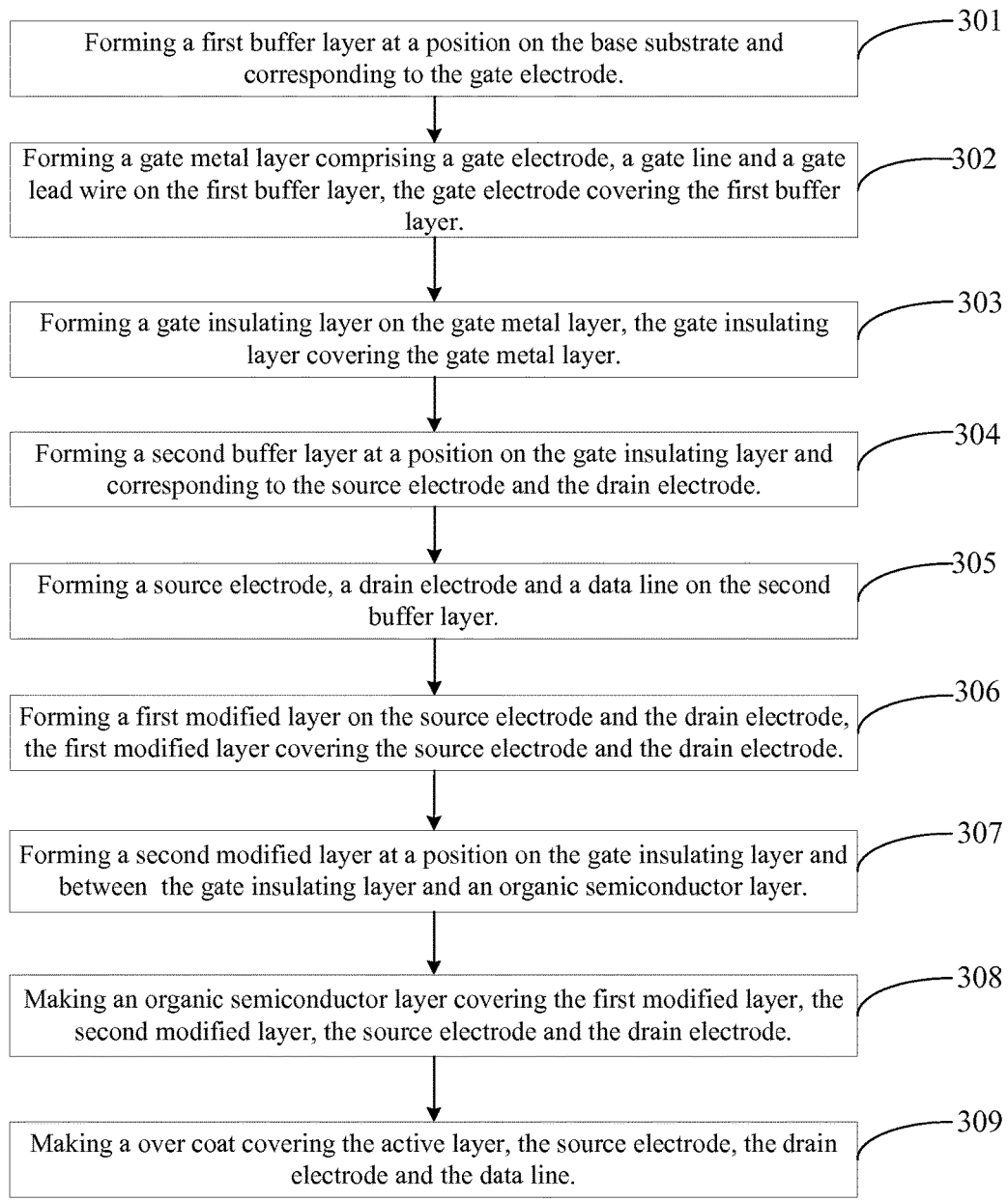
FIG. 6 is a flow chart of still another method for manufacturing an organic thin film transistor provided in an embodiment of the present invention.

Taking forming a buffer layer below the gate electrode, the source electrode and the drain electrode respectively, the buffer layer being covered by the gate electrode, the source electrode and the drain electrode as an example, as shown in FIG. 6, the method may comprise the following Step 301 to Step 309. In order to facilitate understanding, in the following steps, the buffer layer formed below the gate electrode is called a first modified layer and the buffer layer formed below the source electrode and the drain electrode is called a second modified layer. Needless to say, it is only defined herein that the positions of the buffer layers are different, but the materials for forming the buffer layers can be the same. These steps will be described in detail below.

Step 301. Forming a first buffer layer at a position on the base substrate and corresponding to the gate electrode.

For example, a buffer layer can be formed by forming a pattern of the buffer layer using a negative photoresist and then by plating a film using a vacuum or solution method. Alternatively, a film for forming the material of the buffer layer is first plated on the base substrate and then a pattern of the buffer layer is formed using a mask plate.

Step 302. Forming a gate metal layer comprising a gate electrode, a gate line and a gate lead wire on the first buffer layer, the gate electrode covering the first buffer layer.

For example, a metal thin film having a thickness from 1000 Å to 7000 Å can be deposited on a base substrate such as a glass substrate or a quartz substrate using a magnetron sputtering method, wherein the material of the metal thin film generally comprises at least one metal selected from the group consisting of molybdenum, aluminum, aluminum-nickel alloy, molybdenum and tungsten alloy, chromium, copper and the like. Subsequently, a gate metal layer is formed on a certain area of the base substrate using a mask plate by a patterning process such as exposure, development, etching, peeling and the like.

Step 303. Forming a gate insulating layer on the gate metal layer, the gate insulating layer covering the gate metal layer.

Step 304. Forming a second buffer layer at a position on the gate insulating layer and corresponding to the source electrode and the drain electrode.

For example, the second buffer layer can be formed with reference to the method for forming a first buffer layer.

Step 305. Forming a source electrode, a drain electrode and a data line on the second buffer layer.

For example, the data line can be formed using the same method for forming the source electrode and the drain electrode.

Step 306. Forming a first modified layer on the source electrode and the drain electrode, the first modified layer covering the source electrode and the drain electrode.

Step 307. Forming a second modified layer at a position on the gate insulating layer and between the gate insulating layer and an organic semiconductor layer.

Step 308. Making an organic semiconductor layer covering the first modified layer, the second modified layer, the source electrode and the drain electrode.

Step 309. Making a over coat covering the organic semiconductor layer, the source electrode, the drain electrode and the data line.

For example, a over coat having a thickness from 1000 Å to 6000 Å is plated on the entire substrate using a similar method of making the gate insulating layer and the organic semiconductor layer, where the material is generally selected from the group consisting of silicon nitride and a transparent organic resin.

It should be noted that the processes in the present embodiment which are the same as the steps in the above embodiments can be described with reference to the above embodiments, and no further detail will need to be provided herein.

In the method for manufacturing an organic thin film transistor provided in the above embodiments of the present invention, upon manufacturing the organic thin film transistor, a modified layer that can change a contact angle on both the source electrode and the drain electrode is provided at a position below the organic semiconductor layer and corresponding to the source electrode and the drain electrode, the modified layer reducing the contact angle on both the source electrode and the drain electrode. Therefore, the organic semiconductor layer can be in full contact with the source electrode and the drain electrode, which ensures that the organic semiconductor layer can be formed uniformly on the source electrode and the drain electrode, solves the problems of poor formation effects and easy disconnection of the organic semiconductor layer because of a large contact angle on electrode layers in the thin film transistor, guarantees the quality and performance of the thin film transistor, avoids the waste of materials, and therefore reduces production costs, thereby improving production efficiency.

The above are merely exemplary embodiments of the present invention, and are not intended to limit the scope of protection of the present invention, which is yet determined by the appended claims.

The present application claims the priority of the Chinese Patent Application No. 201410413117.2 submitted on Aug. 20, 2014, and the content disclosed in the above Chinese patent application is herein incorporated by reference as part of this application.

What is claimed is:

1. An organic thin film transistor, comprising: a source electrode, a drain electrode, an organic semiconductor layer disposed on the source electrode and the drain electrode, and a modified layer, wherein:
the modified layer is disposed at a position below the organic semiconductor layer and corresponding to the source electrode and the drain electrode, and the modified layer covers the source electrode and the drain electrode; and
the modified layer is configured to change a contact angle on both the source electrode and the drain electrode.

2. The organic thin film transistor according to claim 1, further comprising a gate insulating layer, wherein:
the modified layer is also disposed at a position between the organic semiconductor layer and the gate insulating layer; and
the modified layer is also configured to change a contact angle on the gate insulating layer.

3. The organic thin film transistor according to claim 1, further comprising: a second buffer layer and a gate insulating layer, wherein:
the second buffer layer is disposed at a position below the source electrode and the drain electrode and corresponding to the source electrode and the drain electrode;
the second buffer layer is covered by the source electrode and the drain electrode; and
an adhesion force of a material of the second buffer layer on the gate insulating layer is greater than that of a material of the source electrode and the drain electrode on the gate insulating layer.

4. The organic thin film transistor according to claim 3, further comprising: a gate electrode, and a first buffer layer which are disposed on a base substrate, wherein:
the first buffer layer is disposed at a position below the gate electrode and corresponding to the gate electrode;
the first buffer layer is covered by the gate electrode; and
an adhesion force of a material of the first buffer layer on the base substrate is greater than that of a material of the gate electrode on the base substrate.

5. The organic thin film transistor according to claim 3, wherein the second buffer layer and the first buffer layer independently have a thickness from 20 to 300 nm.

6. The organic thin film transistor according to claim 4, wherein the second buffer layer and the first buffer layer independently have a thickness from 20 to 300 nm.

7. The organic thin film transistor according to claim 1, wherein the modified layer has a thickness from 0.1 to 10 nm.

8. The organic thin film transistor according to claim 1, wherein a material of the source electrode and the drain electrode comprises at least one selected from the group consisting of gold and silver.

9. The organic thin film transistor according to claim 1, wherein a material of the modified layer comprises at least one selected from the group consisting of an organic micromolecular material and a self-assembled micromolecular material.

10. An array substrate, comprising the organic thin film transistor according to claim 1.

11. A display device, comprising the array substrate according to claim 10.

12. A display device, comprising the organic thin film transistor according to claim 1.

13. The organic thin film transistor according to claim 2, further comprising: a second buffer layer, wherein:
the second buffer layer is disposed at a position below the source electrode and the drain electrode and corresponding to the source electrode and the drain electrode;
the second buffer layer is covered by the source electrode and the drain electrode; and
an adhesion force of a material of the second buffer layer on the gate insulating layer is greater than that of a material of the source electrode and the drain electrode on the gate insulating layer.

14. The organic thin film transistor according to claim 13, further comprising: a gate electrode and a first buffer layer which are disposed on a base substrate, wherein:
the first buffer layer is disposed at a position below the gate electrode and corresponding to the gate electrode;
the first buffer layer is covered by the gate electrode; and
an adhesion force of a material of the first buffer layer on the base substrate is greater than that of a material of the gate electrode on the base substrate.

15. A method of manufacturing an organic thin film transistor, comprising:
forming a source electrode, a drain electrode and an organic semiconductor layer on the source electrode and the drain electrode, and
forming a modified layer at a position on the source electrode and the drain electrode and corresponding to the organic semiconductor layer, wherein the modified layer covers the source electrode and the drain electrode and is configured to change a contact angle on both the source electrode and the drain electrode.

16. The method according to claim 15, further comprising:
forming a gate insulating layer, and
forming the modified layer at a position between the gate insulating layer and the organic semiconductor layer, wherein the modified layer is also configured to change a contact angle on the gate insulating layer.

17. The method according to claim 16, further comprising:
forming a second buffer layer below the source electrode and the drain electrode respectively, the second buffer layer being covered by the source electrode and the drain electrode;
wherein an adhesion force of a material of the second buffer layer on the gate insulating layer is greater than that of a material of the source electrode and the drain electrode on the gate insulating layer.

18. The method according to claim 16, further comprising:
forming a gate electrode on a base substrate,
forming a second buffer layer below the source electrode and the drain electrode, the second buffer layer being covered by the source electrode and the drain electrode, and
forming a first buffer layer below the gate electrode, the first buffer layer being covered by the gate electrode;
wherein an adhesion force of a material of the second buffer layer on the gate insulating layer is greater than that of a material of the source electrode and the drain electrode on the gate insulating layer, an adhesion force of a material of the first buffer layer on the base substrate is greater than that of a material of the gate electrode on the base substrate.

19. The method according to claim 15, further comprising:
forming a gate insulating layer, and
forming a second buffer layer below the source electrode and the drain electrode respectively, the second buffer layer being covered by the source electrode and the drain electrode;
wherein an adhesion force of a material of the second buffer layer on the gate insulating layer is greater than that of a material of the source electrode and the drain electrode on the gate insulating layer.

20. The method according to claim 15, further comprising:
forming a gate electrode on a base substrate,
forming a gate insulating layer,
forming a second buffer layer below the source electrode and the drain electrode, the second buffer layer being covered by the source electrode and the drain electrode, and
forming a first buffer layer below the gate electrode, the first buffer layer being covered by the gate electrode;
wherein an adhesion force of a material of the second buffer layer on the gate insulating layer is greater than that of a material of the source electrode and the drain electrode on the gate insulating layer, an adhesion force of a material of the first buffer layer on the base substrate is greater than that of a material of the gate electrode on the base substrate.

* * * * *